(12) United States Patent
Chen et al.

(10) Patent No.: US 10,521,955 B2
(45) Date of Patent: Dec. 31, 2019

(54) POSTURE-GUIDED METHOD AND DEVICE FOR COMBINATION MODELING OF CROSS-CATEGORY THREE-DIMENSIONAL MODELS

(71) Applicant: BEIHANG UNIVERSITY, Beijing (CN)

(72) Inventors: Xiaowu Chen, Beijing (CN); Qiang Fu, Beijing (CN); Bin Zhou, Beijing (CN); Qinping Zhao, Beijing (CN); Xiaotian Wang, Beijing (CN); Sijia Wen, Beijing (CN)

(73) Assignee: BEIHANG UNIVERSITY, Beijing (CN)

( * ) Notice: Subject to any disclaimer, the term of this patent is extended or adjusted under 35 U.S.C. 154(b) by 31 days.

(21) Appl. No.: 15/792,717

(22) Filed: Oct. 24, 2017

(65) Prior Publication Data
US 2019/0012830 A1 Jan. 10, 2019

(30) Foreign Application Priority Data
Jul. 10, 2017 (CN) .......................... 2017 1 0558801

(51) Int. Cl.
| | | |
|---|---|---|
| G06T 17/00 | (2006.01) | |
| G06T 17/50 | (2006.01) | |
| G06F 17/50 | (2006.01) | |
| G06T 17/10 | (2006.01) | |
| G06K 9/00 | (2006.01) | |

(52) U.S. Cl.
CPC .......... *G06T 17/00* (2013.01); *G06F 17/5009* (2013.01); *G06T 17/10* (2013.01); *G06K 9/00281* (2013.01); *G06K 9/00288* (2013.01)

(58) Field of Classification Search
None
See application file for complete search history.

(56) References Cited

U.S. PATENT DOCUMENTS

| | | | | |
|---|---|---|---|---|
| 2011/0091071 | A1* | 4/2011 | Sabe ................ | G06K 9/00281 382/103 |
| 2015/0134302 | A1* | 5/2015 | Chhugani ............. | G06T 19/20 703/1 |

* cited by examiner

*Primary Examiner* — Saptarshi Mazumder
(74) *Attorney, Agent, or Firm* — J.C. Patents (57) ABSTRACT

The disclosed provides a posture-guided cross-category method and device for combination modeling of cross-category 3D models, the method including: receiving a first posture model inputted by a user; calculating similarities between q first regions of the first posture model and q second regions of each of second posture models in a preset model database, respectively; where the model database includes a plurality of models partitioned into model components, and second posture models corresponding to the models; where the q first regions correspond to the q second regions one on one, where q is an integer greater than or equal to 2; selecting a corresponding plurality of model components of the q second regions of the second posture model according to the similarities; and combining the selected plurality of model components to generate a 3D model. The embodiment of the present application can combine cross-category models with large structural differences.

8 Claims, 8 Drawing Sheets

```
Receiving a first posture model inputted by a user           101

Calculating similarities between q first regions
of the first posture model and q second regions of           102
each of second posture models in a preset model
database, respectively Selecting a corresponding plurality of model
components of the q second regions of the second             103
posture model according to the similarities Combining the selected plurality of model                    104
components to generate a 3D model
```

POSTURE-GUIDED METHOD AND DEVICE FOR COMBINATION MODELING OF CROSS-CATEGORY THREE-DIMENSIONAL MODELS

CROSS-REFERENCE TO RELATED APPLICATION

This application claims priority to Chinese Patent Application No. 201710558801.3, filed on Jul. 10, 2017, which is hereby incorporated by reference in its entirety.

TECHNICAL FIELD

The embodiments of the present application relate to a three-dimensional (3D) geometric modeling technique, and more particularly to a posture-guided method and a posture-guided device for combination modeling of cross-category 3D models.

BACKGROUND

With the development of 3D modeling technology and the enrichment of model resources, the method for combination modeling of 3D models has received more and more attention in recent years. Among them, the method for combination modeling of cross-category 3D models becomes an important research focus as it is not limited to model types and can produce more abundant combination modeling results.

In the prior art, when the combination modeling is performed on corss-category 3D models is performed, two or more partitioned models which have a corresponding relationship therebetween are inputted, and a large number of 3D models are obtained by replacing functional sub-structures which have a corresponding relationship therebetween.

However, the above-described method can only perform cross-category combination on models with a similar structure. When cross-category models with large structural differences are combined, the above-described method is not applicable. Therefore, the problem of how to combine the cross-category models with large structural differences is an urgent technical issue.

SUMMARY

The embodiments of the present application provide a posture-guided method and a posture-guided device for combination modeling of cross-category 3D models to solve the technical problem as is how to combine the cross-category models with large structural differences.

In a first aspect, an embodiment of the present application provides a posture-guided method for combination modeling of cross-category 3D models including:

receiving a first posture model inputted by a user;

calculating similarities between q first regions of the first posture model and q second regions of each of second posture models in a preset model database, respectively; where the model database includes a plurality of models partitioned into model components, and second posture models corresponding to the models; where the q first regions correspond to the q second regions one on one, where q is an integer greater than or equal to 2;

selecting a corresponding plurality of model components of the q second regions of the second posture model according to the similarities;

combining the selected plurality of model components to generate a 3D model.

Optionally, the step of calculating the similarities between the q first regions of the first posture model and the q second regions of each of the second posture models in the preset model database includes:

calculating the similarities between the q first regions of the first posture model and the q second regions of each of the second posture models, respectively, according to a formula $$D(p_o, p_k, j) = \|P_o(\tilde{B}_j) - P_k(\tilde{B}_j)\|_2^2 + \sum_{i=1}^{19} \|\omega_i(x_o(i) - x_k(i))\|_2^2$$

where $D(p_o, p_k, j)$ is a similarity between a $j^{th}$ first region and a $j^{th}$ second region, and j is a positive integer smaller than or equal to q, where $p_o$ is a posture in the first posture model, and $p_k$ is a posture in the $k^{th}$ second posture model; $x_o(i)$ and $x_k(i)$ are parameters of skeletons corresponding to $p_o$ and $p_k$ and i=1, ..., 19; $\omega_i$ is the weight, and $P_o(\tilde{B}_j)$ and $P_k(\tilde{B}_j)$ are coordinates of center bone points of the $j^{th}$ first region and the $j^{th}$ second region, respectively.

Optionally, the step of selecting the corresponding plurality of model components of the q second regions of the second posture model according to the similarities includes:

sorting the plurality of similarities corresponding to the respective second regions in a descending order;

selecting the model components corresponding to first n similarities for each of the second regions, where n is a positive integer.

Optionally, the step of selecting the model components corresponding to the first n similarities includes:

for each of the second regions, selecting the model components of a same category corresponding to first s similarities from the model database respectively until the number of the model components selected from all categories reaches n, where s is a positive integer smaller than or equal to n.

Optionally, before the step of combining the selected plurality of model components to generate the 3D models, the method further includes:

determining whether model categories corresponding to the respective model components can be combined;

if the model categories corresponding to the respective model components can be combined, performing the step of combining the selected plurality of model components to generate a 3D model.

Optionally, the step of combining the selected plurality of model components to generate a 3D model includes:

selecting functional components associated with the model components according to the second regions corresponding to the respective model components;

combining the selected plurality of model components via the functional component to generate the3D model.

Optionally, after the step of combining the selected plurality of model components to generate the 3D models, the method further includes:

calculating energy values of a plurality of 3D models according to a formula $E(G_m)=E_1(p_0, G_m)+\beta E_2(y_m)+\gamma E_3(y_m, C)$, where $E(G_m)$ is an energy value of an $m^{th}$ 3D model, $G_m$ is an $m^{th}$ 3D model group, $x_o$ is a first posture model feature, and $\beta=10$, $\gamma=0.1$, where $$E_1(p_0, G_m) = \sum_{j=1}^{4} D(p_0, p_{m_j}, j),$$

$$E_2(y_m) \sum_{i,j} A(i,j) \cdot y_m(i) \cdot y_m(j),$$

$$E_3(y_m, C) = \lambda \|y_m\|_0 + \sum_{c \in C} \|y_m(c) - 1\|_2^2,$$

$E_1(p_o, G_m)$ indicates a sum of four similarities between using postures of a second posture model in the 3D model group $G_m$ and that of corresponding regions of the first posture model, $E_2(y_m)$ is a combination compatibility of the model categories, where $y_m$ is a binary vector, with each element corresponding to one category, and A is a weight matrix for model combination compatibility, $E_3(y_m, C)$ is a user constraint term, C is a set of model categories inputted by the user, and c is one model category in C;

sorting the plurality of energy values, and pushing the 3D models corresponding to the sorted energy values to the user.

In a second aspect, an embodiment of the present application provides a posture-guided device for combination modeling of cross-category 3D models including:

a receiving module, configured to receive a first posture model inputted by a user;

a calculating module, configured to calculate similarities between q first regions of the first posture model and q second regions of each of second posture models in a preset model database, respectively; where the model database includes a plurality of models partitioned into model components, and the second posture models corresponding to the respective models; where the q first regions correspond to the q second regions one on one, where q is an integer greater than or equal to 2;

a selecting module configured to select a corresponding plurality of model components of the q second regions of the second posture model according to the similarities;

a generation module, configured to combine the selected plurality of model components to generate a 3D model.

Optionally, the calculating module is specifically configured to:

calculate the similarities between the q first regions of the first posture model and the q second regions of each of the second posture models respectively, according to a formula $$D(p_o, p_k, j) = \|P_o(\tilde{B}_j) - P_k(\tilde{B}_j)\|_2^2 + \sum_{i=1}^{19} \|\omega_i(x_o(i) - x_k(i))\|_2^2;$$

where $D(p_o, p_k, j)$ is a similarity between a $j^{th}$ first region and a $j^{th}$ second region, and j is a positive integer smaller than or equal to q, where $p_o$ is a posture in the first posture model, and $p_k$ is a posture in the $k^{th}$ second posture model; $x_o(i)$ and $x_k(i)$ are parameters of skeletons corresponding to $P_o$ and $P_k$ and i=1, . . . , 19; $\omega_i$ is the weight, and $P_o(\tilde{B}_j)$ and $P_k(\tilde{B}_j)$ are coordinates of center bone points of the $j^{th}$ first region and the $j^{th}$ second region, respectively.

Optionally, the selecting module is specifically configured to:

sort the corresponding plurality of similarities of the respective second regions in a descending order;

select the model components corresponding to first n similarities for each of the second regions;

where n is a positive integer.

Optionally, the selecting module is specifically configured to:

for each of the second regions, select the model components of a same category corresponding to first s similarities from the model database respectively until the number of the model components selected from all categories reaches n, where s is a positive integer smaller than or equal to n.

Optionally, the device further includes: a determining module, where:

the determining module is configured to determine whether model categories corresponding to the respective model components can be combined;

the generating module is configured to combine the selected plurality of model components to generate the 3D model when the determining module determines that the model categories corresponding to the respective model components can be combined.

Optionally, the generating module is specifically configured to:

select functional components associated with the model component according to the second regions corresponding to the respective model components;

combine the selected plurality of model components via the functional components to generate a 3D model.

Optionally, the calculating module is specifically configured to:

calculate energy values of a plurality of 3D models according to a formula $E(G_m)=E_1(p_0, G_m)+\beta E_2(y_m)+\gamma E_3(y_m, C)$, where $E(G_m)$ is an energy value of an $m^{th}$ 3D model, $G_m$ is an $m^{th}$ 3D model group, $x_o$, is a first posture model feature, and $\beta=10$, $\gamma=0.1$, where $$E_1(p_0, G_m) = \sum_{j=1}^{4} D(p_0, p_{m_j}, j),$$

$$E_2(y_m) \sum_{i,j} A(i,j) \cdot y_m(i) \cdot y_m(j),$$

$$E_3(y_m, C) = \lambda \|y_m\|_0 + \sum_{c \in C} \|y_m(c) - 1\|_2^2,$$

$E_1(p_o, G_m)$ indicates a sum of four similarities between using postures of a second posture model in the 3D model group $G_m$ and that of corresponding regions of the first posture model, $E_2(y_m)$ is a combination compatibility of the model categories, where $y_m$ is a binary vector, with each element corresponding to one category, and A is a weight matrix for model combination compatibility, $E_3(y_m, C)$ is a user constraint term, C is a set of model categories inputted by the user, and c is one model category in C;

sort the plurality of energy values, and push the 3D models corresponding to the sorted energy values to the user.

The posture-guided method and device for combination modeling of cross-category 3D models provided by the embodiment of the present application receive the first posture model inputted by the user; calculate similarities between the q first regions of the first posture model and the q second regions of each of second posture models in the preset model database; where the model database includes a plurality of models partitioned into model components, and the second posture models corresponding to the respective models; the q first regions correspond to the q second regions one on one; select the corresponding plurality of model components of q second regions of the second posture model according to the similarities; and combine the selected plurality of model components to generate the 3D model. The cross-category models with large structural differences can be combined by calculating the similarities between the first regions of the first posture model inputted by the user and the second regions of each of the second posture models in the model database, selecting the corresponding plurality of model components of the second regions according to the similarities, and combining the model components.

BRIEF DESCRIPTION OF DRAWINGS

In order to illustrate the technical solutions in the embodiments of present application or the prior art more clearly, the drawings required for describing the embodiments or the prior art will now be briefly described. It will be apparent that the drawings described as below are some embodiments of the present application, and other drawings may be obtained by those skilled in the art based on those drawings without making any creative work.

FIG. 4b is a schematic diagram of node connections of the model in FIG. 4a;

FIG. 5b is a schematic diagram of node connections of the model in FIG. 5a;

DESCRIPTION OF EMBODIMENTS

To make the objects, technical solutions and advantages of embodiments of the present application clearer, the technical solutions in the embodiments of the present application will now be described distinctly and completely with reference to the drawings in the embodiments of the present application. Obviously, the described embodiments are part rather than all of the embodiments of the present application. All the other embodiments obtained by those ordinary skilled in the art based on the embodiments of the present application without making creative work are within the scope of the present application.

The posture-guided method and device for combination modeling of cross-category 3D models provided by the embodiment of the present application can be applied in the field of creative design, computer aided design and the like, and is especially suitable for the scene where cross-category combination modeling for 3D models of different categories is performed. In the embodiments of the present application, the method for combination modeling of cross-category 3D models guided by the human posture in a first posture model can quickly build a large number of cross-category combined 3D models, and provide 3D materials for applications such as 3D animation and product design.

The embodiments of the present application mainly direct to the technical problem of how to perform a cross-category combination modeling for 3D models of different categories with large structural differences. In the prior art, when the combination modeling is performed on 3D models is performed, two or more partitioned models are inputted, and there is a corresponding relationship between components generated after partitioning. A large number of 3D models are obtained by replacing functional sub-structures having corresponding relationships therebetween. The prior art can only perform cross-category combination on model categories with a similar structure, as it is difficult to determine the corresponding relationship between the components of the cross-category models.

Therefore, the posture-guided method and device for combination modeling of cross-category 3D models provided by the embodiments of the present application aim at solving the technical problem of how to perform cross-category combination modeling on 3D models of different categories with large structural differences.

The technical solutions of the present application will be described in detail with reference to specific embodiments. The following several specific embodiments may be combined with each other, and the same or similar concept or process may not be repeated in some embodiments.

Figure 1:
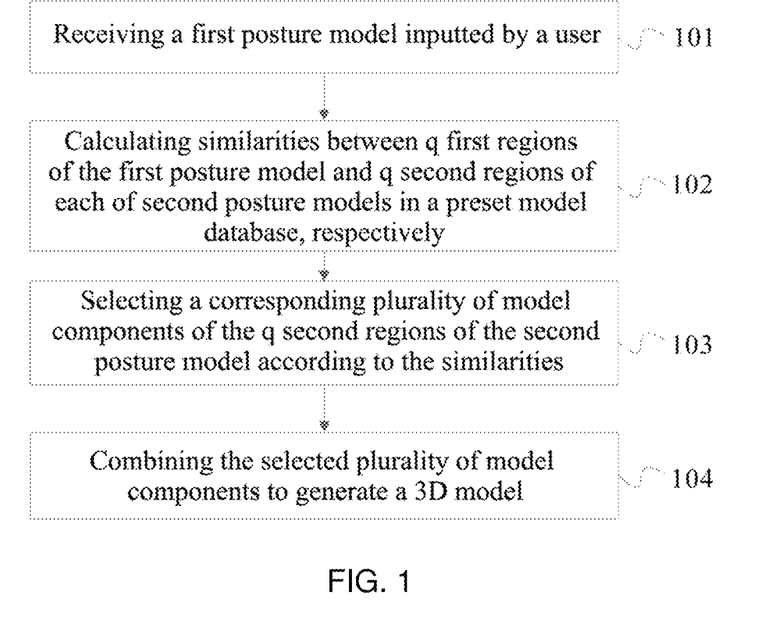
FIG. 1 is a flow diagram of a first embodiment of a posture-guided method for combination modeling of cross-category 3D models provided by an embodiment of the present application.

FIG. 1 is a flow diagram of a first embodiment of the posture-guided method for combination modeling of cross-category 3D models provided by an embodiment of the present application. As shown in FIG. 1, the method includes the following steps:

Step 101: receiving a first posture model inputted by a user.

Figure 2:
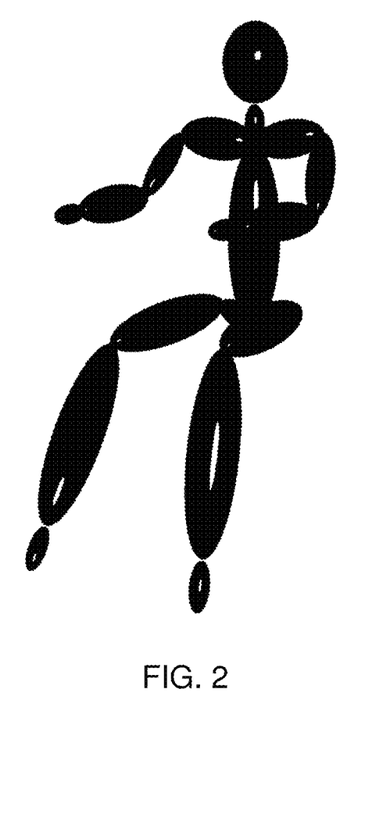
FIG. 2 is a schematic structural diagram of a first posture model.

The executing object of the embodiments of the present application may be a terminal device, for example, a mobile phone, a computer, a tablet computer, and the like. In the present embodiment, FIG. 2 is a schematic structural diagram of the first posture model. As shown in FIG. 2, a human body model may be pre-stored in the terminal device, the user inputs a parameter, for example, a coordinate of a center bone point of a back or a hand, into the terminal device, and the terminal device generates a human posture, i.e., a first posture model, based on the parameter input by the user and the pre-stored human body model. As a matter of course, the user may also input the first posture model into the terminal device directly.

Step 102: calculating similarities between q first regions of the first posture model and q second regions of each of second posture models in a preset model database, respectively; where the model database includes a plurality of models partitioned into model components, and the second posture models corresponding to the respective models; where the q first regions correspond to the q second regions one on one, where q is an integer greater than or equal to 2.

Figure 3:
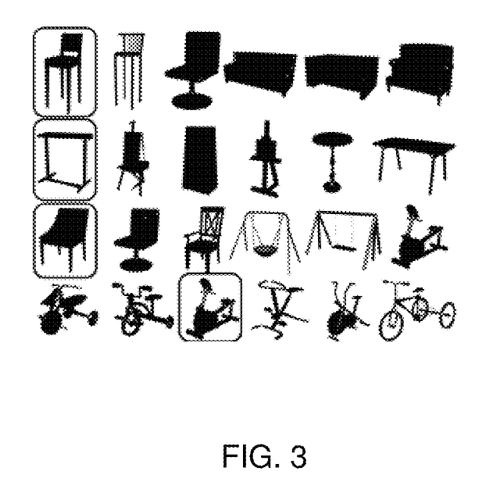
FIG. 3 is a schematic diagram of 3D models included in a model database.

In the present embodiment, a model database is prebuilt in the terminal device, and the model database includes a plurality of models partitioned into model components, and second posture models corresponding to the respective models. FIG. 3 is a schematic diagram of 3D models included in the model database. As shown in FIG. 3, the model database may include the following 18 categories of 3D models, such as tables, chairs, beds, easels, fitness equipment, electronic organs, swings, bookshelves, sofas, desk lamps, cabinets, tablet computers, scooters, strollers, bicycles, tricycles, trolleys and wheel chairs, that can directly interact with the user. The terminal device may pre-partition each of the above-described 3D models to obtain component-level 3D models, e.g., a table is partitioned into a desktop, table legs and so on, a chair is partitioned into handles, a backrest, a chair seat, chair legs, and so on. After partitioning, a structure of these models can be shown using a relation diagram of the components, that is, the components of the model are nodes of the relation diagram. If two components are connected to each other, between the components there is a line which connects two corresponding nodes. For example, as a desktop and a table leg are connected to each other, the desktop and the table leg are regarded as two nodes, and a line is provided to connect these two nodes.

In addition, the model database also includes the second posture models matching with each of the 3D models described above. Specifically, each object in the model database may be labeled with its user's human body posture, that is, the second posture models are edited, and the postures are adjusted to match with the labeled 3D models. Therefore, there are several second posture models in the model database. It should be noted that the user's human body posture can be labeled only for each object in the model database. For example, the human body posture is labeled for such as only the chair category, the table category, or also each 3D model in the model database. The specific way labeling is performed is not limited in the present embodiment. After labeling, the second posture model may further be partitioned into q second regions. Optionally, the second posture model may be partitioned into four second regions, such as a hand, a back, a buttock and a leg. In addition, for the partitioned model components, components in contact with the second regions are labeled as different categories, so as to indicate their using functionalities. If a chair is partitioned into handles, a backrest, a chair seat and chair legs, the components in contact with the hands are the handles, the component in contact with the back is the backrest, the component in contact with the buttock is the chair seat and the components in contact with the legs are the chair legs.

The terminal device, after receiving the first posture model inputted by the user, automatically partitions the first posture model into q first regions. Optionally, the first posture model may be partitioned into four first regions, such as hands, a back, a buttock and legs. After the partitioning, similarities between q first regions of the first posture model and q first regions of each of second posture models in the model database are calculated, with the q first regions corresponding to the q second regions one on one. For example, if the first posture model is partitioned into four first regions, i.e., hands, a back, a buttock and legs respectively, then each of the second posture models in the model database is correspondingly partitioned into four first regions, i.e., hands, a back, a buttock and legs, respectively. The terminal device will calculate a similarity between the hands in the first posture model and the hands in each of the second posture models in the model database, a similarity between the back in the first posture model and the back in each of the second posture models in the model database, a similarity between the buttock in the first posture model and the buttock in each of the second posture models in the model database and a similarity between the legs in the first posture model and the legs in each of the second posture models in the model database, and obtain a model sequence of four similarities after the calculation.

Optionally, the above-mentioned step 102 includes calculating the similarities between the q first regions of the first posture model and the q second regions of each of the second posture models respectively, according to formula (1):

$$D(p_o, p_k, j) = \|P_o(\tilde{B}_j) - P_k(\tilde{B}_j)\|_2^2 + \sum_{i=1}^{19} \|\omega_i(x_o(i) - x_k(i))\|_2^2 \quad (1)$$

where $D(p_o, p_k, j)$ is a similarity between a $j^{th}$ first region and a $j^{th}$ second region, and j is a positive integer smaller than or equal to q, where $p_o$ is a posture in the first posture model, and $p_k$ is a posture in the $k^{th}$ second posture model; $x_o(i)$ and $x_k(i)$ are parameters of skeletons corresponding to $p_o$ and $p_k$ and i=1, . . . , 19; $\omega_i$ is the weight, and $P_o(\tilde{B}_j)$ and $P_k(\tilde{B}_j)$ are coordinates of center bone points of the $j^{th}$ first region and the $j^{th}$ second region, respectively.

Specifically, after the user inputs the first posture model via the interactive interface, the terminal device sets the human body posture in the first posture model as $P_o$, sets the human body posture of the $k^{th}$ second posture model in the model database as $P_k$, then the similarity between the $j^{th}$ first region in the first posture model and the $j^{th}$ second region in the $k^{th}$ second posture model in the model database can be calculated according to the formula (1). In addition, the parameter of the skeleton includes the angle between joints in the skeleton. According to the above-described formula, a similarity sequence may be calculated for each of the first regions.

Step 103: selecting a corresponding plurality of model components of the q second regions of the second posture model according to the similarities.

In the present embodiment, the terminal device, after calculating the similarities between the q first regions of the first posture model and the q second regions of each of the second posture models in the model database, selects the corresponding model components of the second regions with a larger similarity to each of the first regions in the first posture model from the model database according to the calculated similarities. For example, as shown in FIGS. 2 and 3, if the first regions of the first posture model in FIG. 2 include hands and a buttock, the second regions of the corresponding second posture model of each model in the model database also include hands and a buttock. After the similarities between the hands of the first region and the hands of the plurality of second regions are calculated, model components corresponding to the hands of one or more second region with a larger similarity will be selected. For example, one or more of the handle model component of the bicycle, the handle model component of the fitness equipment, or the handle model component of the tricycle in the model database are selected. After the similarities between the buttock of the first region and the buttocks of the plurality of second regions are calculated, model components corresponding to the buttock of one or more second region with a larger similarity will be selected. For example, one or more of the chair seat model component of the chair, the chair seat model component of the sofa, and the chair seat model component of the tricycle in the model database are selected.

Optionally, the above step 103 may specifically include sorting the corresponding plurality of similarities of the respective second regions in a descending order; and selecting the model components corresponding to first n similarities for each of the second regions, where n is a positive integer.

Specifically, as the model database includes a plurality of second posture models, a plurality of similarities may be calculated for each of the second regions according to the formula (1). The terminal device sorts the calculated plurality of similarities in a descending order, and selects the model components corresponding to first n similarities, that is, selects the corresponding model components of the second regions which are more similar to those of the first region.

Further, in order to recommend a more reasonable combination model, it is necessary to perform a combinatorial screening on the selected models. In order to ensure that models of more categories involve in the combination and the cost is reduced, after calculating the corresponding plurality of similarities of the second regions, the model components of a same category corresponding to first s similarities are respectively selected from the model database until the number of the model components selected from all categories reaches n, where s is a positive integer smaller than or equal to n. Specifically, the terminal device takes the model components corresponding to the first s similarities for the same category from the model components corresponding to the respective second regions. For example, the model components corresponding to the first 3 similarities will be taken from the bicycle category, and the model components corresponding to the first 3 similarities will be further taken from the tricycle category. In addition, only the first t models of the entire similarity sequence may involve in the combination. For example, only the first 9 models involve in the combination. Then, a series of model combinations with respect to the p second regions may be obtained, which may avoid the selected model components from being selected from a single model, and thus may ensure that models of more categories involve in the combination.

Step 104: combining the selected plurality of model components to generate a 3D model.

In the present embodiment, after the plurality of model components are selected, the selected plurality of model components may be combined to generate a 3D model, where the plurality of model components are model components corresponding to different second regions. For example, the model component corresponding to the back and the model components corresponding to the hands are combined. In addition, the generated 3D model may be one, or may be more than one. The number of the 3D models is not limited in the present embodiment.

Figure 4A:
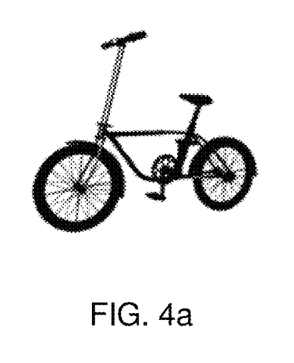
FIG. 4a is a schematic diagram of a bicycle model.
Figure 4B:
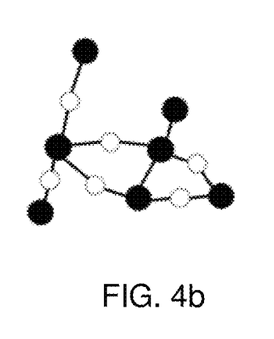
Figure 5A:
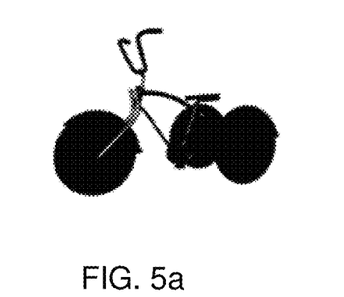
FIG. 5a is a schematic diagram of a tricycle model.
Figure 5B:
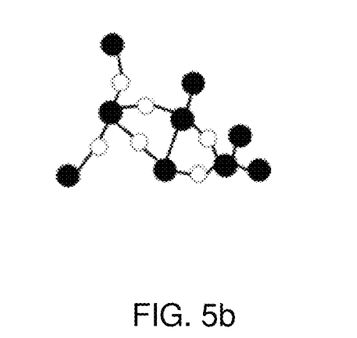
Figure 6A:
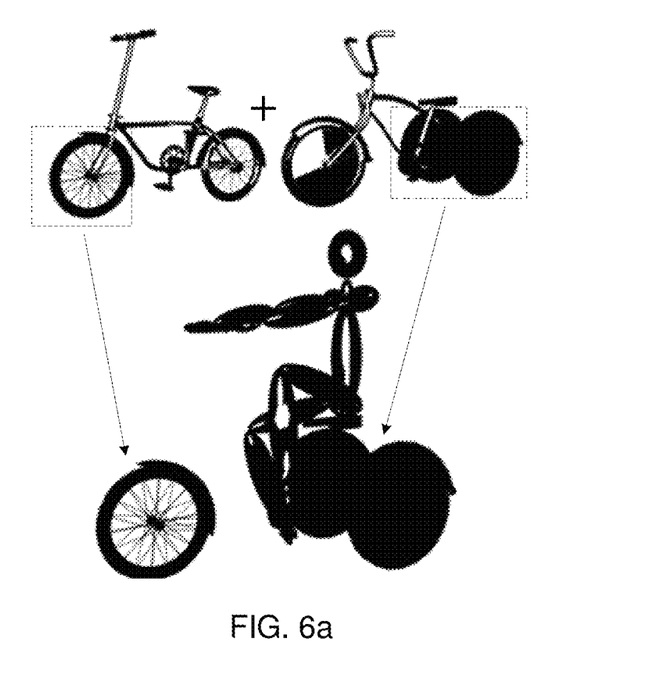
FIG. 6a is a schematic diagram of a combination of model components.
Figure 6B:
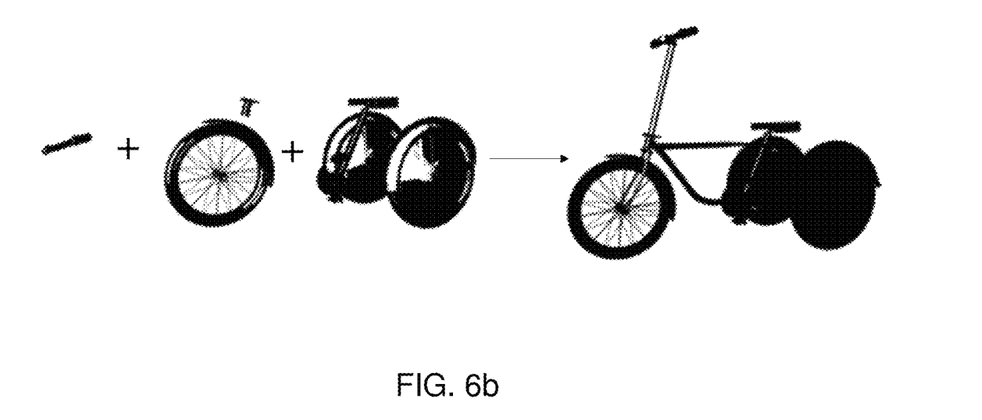
FIG. 6b is another schematic diagram of the combination of the model components.
Figure 6C:
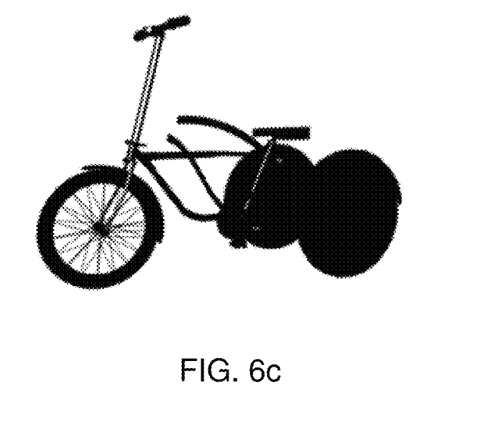
FIG. 6c is yet another schematic diagram of the combination of the model components.
Figure 6D:
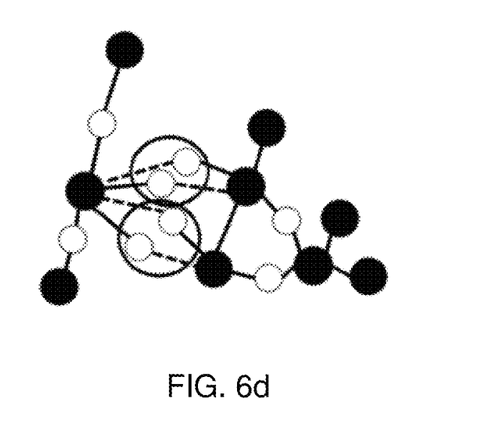
FIG. 6d is a schematic diagram of node connections of the model in FIG. 6c.

In practical applications, when performing a combination between a plurality of model components, the terminal device will select functional components associated with the model components according to the second regions corresponding to each of the selected model components. Moreover, the user is also required to input base component into the terminal device via the interactive interface of the terminal device, and the terminal device will combine the plurality of model components via the functional components. In addition, FIG. 4a is a schematic diagram of a bicycle model, FIG. 4b is a schematic diagram of node connections of the model in FIG. 4a, FIG. 5a is a schematic diagram of a tricycle model, and FIG. 5b is a schematic diagram of node connections of the model in FIG. 5a. As shown in FIGS. 4a to 5b, in order to connect these components into a complete structure, the terminal equipment first sets, except from the functional nodes in the original structural graph of each of the models, the nodes with a degree other than 2 as relay nodes, and the nodes with a degree of 2 as connection nodes. For example, the solid nodes in FIGS. 4b and 5b represent the relay nodes, and the hollow nodes represent the connection nodes. FIG. 6a is a schematic diagram of a combination of model components, FIG. 6b is another schematic diagram of the combination of the model components, FIG. 6c is yet another schematic diagram of the combination of the model components, FIG. 6d is a schematic diagram of node connections of the model in FIG. 6c. As shown in FIGS. 6a-6d, positions of the components corresponding to the nodes in FIGS. 4b and 5b are adjusted according to the first posture model, and the relay nodes and the connection nodes, which do not overlap and have a distance from an adjacent node in the new structure that is similar to that in the original structure, are taken to construct the structure relation diagram of the combined model. For example, according to the first posture model shown in FIG. 2, the seat model component, the rear wheel model component of the tricycle are combined with the front wheel model component and the handle model component of the bicycle to generate a 3D model in FIG. 6c.

Optionally, in order to generate combined models for multiple users, on the basis of the above-described implementation that generates models satisfying a single user, the 3D models generated by the above-described implementation may be combined by adjusting the center position of the second posture model bound thereto. After the user selects the base component, these combined models for a single user will further generate combined models for multiple users by using the above-described combination method.

Optionally, in order to make the generated 3D model more reasonable, before combining the selected plurality of model components to generate a 3D model, it may also be determined whether model categories corresponding to the respective model components can be combined; if the model categories corresponding to the respective model components can be combined, then the selected plurality of model components are combined to generate a 3D model.

Specifically, the terminal device may collect sample data inputted by the user, which are scores given by the user in term of whether the object categories of any two models in the model database can be combined, and obtain a priori combination compatibility between any two model categories based on the sample data. For example, if the score in terms of two object categories that can be combined is smaller than a preset value, it can identify that the two object categories cannot be combined, and if the score is greater than the preset value, it can identify that the two object categories can be combined. The terminal will store the determining results after making determination for any two of all the categories.

After selecting the plurality of model components, the terminal device will determine whether model categories to which the components belong can be combined based on the stored determining results; if so, combine the selected plurality of model components, otherwise, send a prompting message to the user to prompt the user that these categories cannot be combined, or re-select new model components. The rationality of the combination of the model components is improved by combining the plurality of model components when it is determined that the model categories corresponding to the model components can be combined.

Optionally, the user may also input the category of the model object via the interactive interface according to his own preferences or the actual situation. The terminal device will calculate an energy value of each of the generated 3D models according to the model category inputted by the user. In practical application, the energy values of a plurality of 3D models are calculated according to the formula (2), then the plurality of energy values are sorted, and the 3D models corresponding to the sorted energy values are pushed to the user. In this way, the terminal device can recommend the combined 3D models to the user according to the user's preferences or the actual situation, such that the user's experience is improved.

$$E(G_m)=E_1(p_0, G_m)+\beta E_2(y_m)+\pm E_3(y_m, C) \qquad (2)$$

where $E(G_m)$ is a an energy value of $m^{th}$ 3D model, $G_m$ is $m^{th}$ 3D model group, $x_o$ is a first posture model feature, and $\beta=10$, $\gamma=0.1$, where $$E_1(p_0, G_m) = \sum_{j=1}^{4} D(p_0, p_{m_j}, j),$$

$$E_2(y_m) \sum_{i,j} A(i, j) \cdot y_m(i) \cdot y_m(j),$$

$$E_3(y_m, C) = \lambda \|y_m\|_0 + \sum_{c \in C} \|y_m(c) - 1\|_2^2,$$

$E_1(p_o, G_m)$ indicates a sum of four similarities between using postures of a second posture model in the 3D model group $G_m$ and that of corresponding regions of the first posture model, $E_2(y_m)$ is a combination compatibility of the model categories, where $y_m$ is a binary vector, with each element corresponding to one category, and A is a weight matrix for model combination compatibility, $E_3(y_m, C)$ is a user constraint term, C is a set of model categories inputted by the user, and c is one model category in C.

In the posture-guided method for combination modeling of cross-category 3D models provided by the embodiment of the present application, the first posture model inputted by the user is received; similarities between the q first regions of the first posture model and the q second regions of each of second posture models in the preset model database are calculated; where the model database includes a plurality of models partitioned into model components, and the second posture models corresponding to the respective models; the q first regions correspond to the q second regions one on one; the corresponding plurality of model components of the q second regions of the second posture model are selected according to the similarities; and the selected plurality of model components are combined to generate the 3D model. The cross-category models with large structural differences can be combined by calculating the similarities between the first regions of the first posture model inputted by the user and the second regions of each of the second posture models in the model database, selecting the corresponding plurality of model components of the second regions according to the similarities, and combining the model components. In addition, the present application, by using the first posture model input by the user, can generate a cross-category 3D combined model and thus improves the automation degree of the combination modeling.

Figure 7:
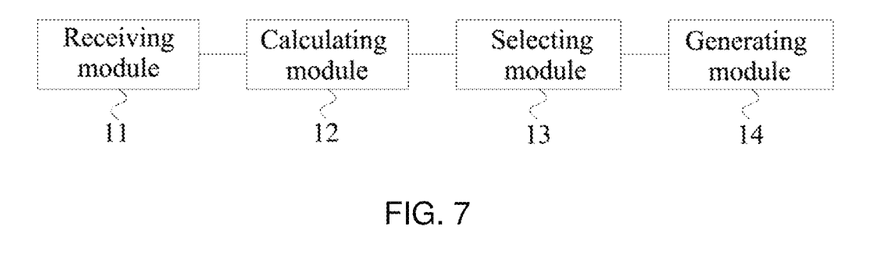
FIG. 7 is a schematic structural diagram of a first embodiment of the posture-guided device for combination modeling of cross-category 3D models provided by an embodiment of the present application.

FIG. 7 is a schematic structural diagram of a first embodiment of the posture-guided device for combination modeling of cross-category 3D models provided by an embodiment of the present application, and the device can be located I the terminal device. As shown in FIG. 7, the device includes a receiving module 11, a calculating module 12, a selecting module 13 and a generating module 14, where:

the receiving module 11 is configured to receive a first posture model inputted by a user;

the calculating module 12 is configured to calculate similarities between q first regions of the first posture model and q second regions of each of second posture models in a preset model database, respectively; where the model database includes a plurality of models partitioned into model components, and the second posture models corresponding to the respective models; where the q first regions correspond to the q second regions one on one, where q is an integer greater than or equal to 2;

the selecting module 13 is configured to select a corresponding plurality of model components of the q second regions of the second posture model according to the similarities;

the generating module 14 is configured to combine the selected plurality of model components to generate a 3D model.

The embodiment of the present application provides a posture-guided device for combination modeling of cross-category 3D models, where the receiving module 11 receives the first posture model inputted by the user; the calculating module 12 calculates similarities between the q first regions of the first posture model and the q second regions of each of the second posture models in the preset model database; where the model database includes the plurality of models partitioned into model components, and the second posture models corresponding to each of the models; the q first regions correspond to the q second regions one on one; the selecting module 13 selects the corresponding plurality of model components of the q second regions of the second posture model according to the similarities; and the generating module 14 combines the selected plurality of model components to generate a 3D model. The cross-category models with large structural differences can be combined by calculating the similarities between the first regions of the first posture model inputted by the user and the second regions of each of the second posture models in the model database, selecting the corresponding plurality of model components of the second regions according to the similarities, and combining the model components.

Optionally, the calculating module 12 is specifically configured to:

calculate the similarities between the q first regions of the first posture model and the q second regions of each of the second posture models, respectively, according to formula of $$D(p_o, p_k, j) = \|P_o(\tilde{B}_j) - P_k(\tilde{B}_j)\|_2^2 + \sum_{i=1}^{19} \|\omega_i(x_o(i) - x_k(i))\|_2^2;$$

where $D(p_o, p_k, j)$ is a similarity between a $j^{th}$ first region and a $j^{th}$ second region, and j is a positive integer smaller than or equal to q, where $p_o$ is a posture in the first posture model, and $p_k$ is a posture in the $k^{th}$ second posture model; $x_o(i)$ and $x_k(i)$ are parameters of skeletons corresponding to $p_o$ and $p_k$ and $i=1, \ldots, 19$; $\omega_i$ is the weight, and $P_o(\tilde{B}_j)$ and $P_k(\tilde{B}_j)$ are coordinates of center bone points of the $j^{th}$ first region and the $j^{th}$ second region, respectively.

Optionally, the selecting module 13 is specifically configured to:

sort the plurality of similarities corresponding to the respective second regions in a descending order;

selecting the model components corresponding to first n similarities for each of the second regions;
where n is a positive integer.

Optionally, the selecting module 13 is specifically configured to:

for each of the second regions, select the model components of a same category corresponding to first s similarities from the model database respectively until the number of the model components selected from all categories reaches n, where s is a positive integer smaller than or equal to n.

The posture-guided device for combination modeling of cross-category 3D models provided by the embodiment of the present application can implement the above-described method embodiments, and the implementation principle and technical effect are similar to those of the above, and will not be repeated here.

Figure 8:
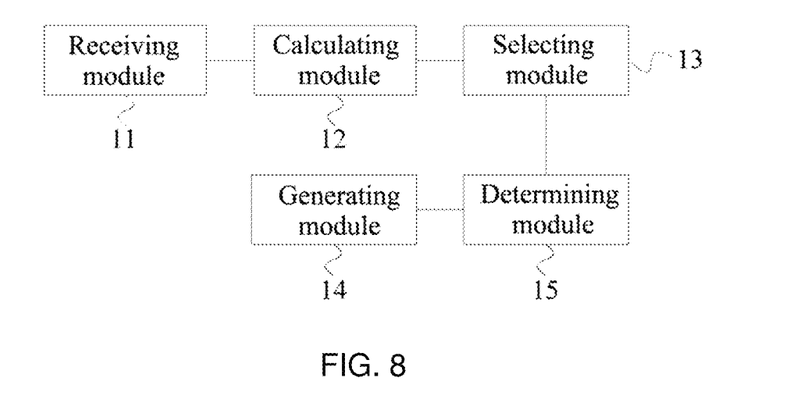
FIG. 8 is a schematic structural diagram of a second embodiment of the posture-guided device for combination modeling of cross-category 3D models provided by an embodiment of the present application.

FIG. 8 is a schematic structural diagram of a second embodiment of the posture-guided method for combination modeling of cross-category 3D models provided by an embodiment of the present application. On the basis of the embodiment shown in FIG. 7, the device further includes: a determining module 15, where:

the determining module 15 is configured to determine whether model categories corresponding to the respective model components can be combined;

the generating module 14 is configured to combine the selected plurality of model components to generate a 3D model when the determining module 15 determines that the model categories corresponding to the respective model components can be combined.

The posture-guided device for combination modeling of cross-category 3D models provided by the embodiment of the present application can implement the above-described method embodiments, and the implementation principle and technical effect are similar to those of the above, and will not be repeated here.

Optionally, the generating module 14 is specifically configured to:

select functional components associated with the model components according to the second regions corresponding to the respective model components;

combine the selected plurality of model components via the functional components to generate a 3D model.

Optionally, the calculating module 12 is specifically configured to:

calculate energy values of a plurality of 3D models according to a formula $E(G_m)=E_1(p_0, G_m)+\beta E_2(y_m)+\gamma E_3(y_m, C)$, where $E(G_m)$ is an energy value of an $m^{th}$ 3D model, $G_m$ is an $m^{th}$ 3D model group, $x_o$ is a first posture model feature, and $\beta=10$, $\gamma=0.1$, where $$E_1(p_0, G_m) = \sum_{j=1}^{4} D(p_0, p_{m_j}, j),$$

$$E_2(y_m) \sum_{i,j} A(i, j) \cdot y_m(i) \cdot y_m(j),$$

$$E_3(y_m, C) = \lambda \|y_m\|_0 + \sum_{c \in C} \|y_m(c) - 1\|_2^2,$$

$E_1(p_o, G_m)$ indicates a sum of four similarities between using postures of a second posture model in the 3D model group $G_m$ and that of corresponding regions of the first posture model, $E_2(y_m)$ is a combination compatibility of the model categories, where $y_m$ is a binary vector, with each element corresponding to one category, and A is a weight matrix for model combination compatibility, $E_3(y_m, C)$ is a user constraint term, C is a set of model categories inputted by the user, and c is one model category in C;

sort the plurality of energy values, and push the 3D models corresponding to the sorted energy values to the user.

The posture-guided device for combination modeling of cross-category 3D models provided by the embodiment of the present application can implement the above-described method embodiments, and the implementation principle and technical effect are similar to those of the above, and will not be repeated here.

It will be understood by those ordinary skilled in the art that all or some of the steps for implementing the various method embodiments described above may be accomplished by hardware associated with program instructions. The aforementioned program may be stored in a computer-readable storage medium. When the program is executed, the steps including the various method embodiments described above are performed. The aforementioned storage medium includes a medium, such as a ROM, a RAM, a magnetic disk, an optical disk, or the like, on which store program codes can be stored.

Finally, it should be noted that the above embodiments are merely used to illustrate the technical solutions of the present application and are not intended to limit the same. While the present application has been described in detail with reference to the foregoing embodiments, it should be understood by those ordinary skilled in the art that it is still possible to modify the technical solutions described in the foregoing embodiments or to equivalently substitute some or all of the technical features therein, and these modifications or substitutions do not make the essential aspects of the corresponding technical solutions depart from the scopes of the technical solutions of the embodiments of the present application.

What is claimed is:

1. A posture-guided method for combination modeling of cross-category 3D models, comprising:

receiving a first posture model inputted by a user;

calculating similarities between q first regions of the first posture model and q second regions of each of second posture models in a preset model database respectively; wherein the model database comprises a plurality of models partitioned into model components, and second posture models corresponding to the models; the q first regions correspond to the q second regions one on one, wherein q is an integer greater than or equal to 2;

selecting one or more model components for each of the q first regions of the first posture model according to the similarities;

combining the model components selected for the q first regions of the first posture model to generate a cross-category 3D model, wherein the model components selected for the q first regions of the first posture model correspond to second regions of at least two different categories of second posture models, wherein the calculating similarities between q first regions of the first posture model and q second regions of each of second posture models in a preset model database respectively comprises:

calculating the similarities between the q first regions of the first posture model and the q second regions of each of the second posture models respectively according to a formula $$D(p_o, p_k, j) = \|P_o(\tilde{B}_j) - P_k(\tilde{B}_j)\|_2^2 + \sum_{i=1}^{19} \|\omega_i(x_o(i) - x_k(i))\|_2^2;$$

wherein $D(p_o, p_k, j)$ is a similarity between a $j^{th}$ first region and a $j^{th}$ second region, and j is a positive integer smaller than or equal to q, wherein $p_o$ is a posture in the first posture model, and $p_k$ is a posture in a $k^{th}$ second posture model; $x_o(i)$ and $x_k(i)$ are parameters of skeletons corresponding to $p_o$ and $p_k$, and i=1, ..., 19; $\omega_i$ is a weight, and $P_0(\tilde{B}_j)$ and $P_k(\tilde{B}_j)$ are coordinates of center bone points of the $j^{th}$ first region and the $j^{th}$ second region, respectively, and the $\|P_o(\tilde{B}_j) - P_k(\tilde{B}_j)\|_2^2$ is a square of an L2 norm of $P_o(\tilde{B}_j) - P_k(\tilde{B}_j)$, and the $\|\omega_i(x_o(i) - x_k(i))\|_2^2$ is a square of an L2 norm of $\omega_i(x_0(i) - x_k(i))$.

2. The method according to claim 1, wherein the selecting one or more model components for each of the q first regions of the first posture model according to the similarities comprises:

sorting, for each of the q first regions, the plurality of similarities corresponding to the second regions which correspond to the each of the q first regions in a descending order;

selecting the model components corresponding to first n similarities for each of the q first regions, wherein n is a positive integer.

3. The method according to claim 2, wherein the selecting the model components corresponding to first n similarities for each of the q first regions comprises:

for each of the first regions, selecting the model components of a same category corresponding to first s similarities from the model database respectively until a number of the model components selected from all categories reaches n, where s is a positive integer smaller than or equal to n.

4. The method according to claim 1, wherein before the combining the model components selected for the q first regions of the first posture model to generate a cross-category 3D model, the method further comprises:

determining whether model categories corresponding to the respective model components can be combined;

if the model categories corresponding to the respective model components can be combined, performing the step of combining the model components selected for the q first regions of the first posture model to generate the cross-category 3D model.

5. The method according claim 1, wherein the combining the model components selected for the q first regions of the first posture model to generate a cross-category 3D model comprises:

selecting functional components associated with the model components according to the second regions corresponding to the respective model components;

combining the model components selected for the q first regions of the first posture model-via the functional components to generate the cross-category 3D model.

6. The method according to claim 1, wherein the combining the model components selected for the q first regions of the first posture model to generate a cross-category 3D model comprises: combining the model components selected for the q first regions of the first posture model to generate a plurality of cross-category 3D models, and after the combining the model components selected for the q first regions of the first posture model to generate a plurality of cross-category 3D models, the method further comprises:

calculating energy values of the plurality of cross-category 3D models according to a formula $E(G_m)=E_1(p_0, G_m)+\beta E_2(y_m)+\gamma E_3(y_m, C)$, where $E(G_m)$ is an energy value of an $m^{th}$ 3D model, $G_m$ is an $m^{th}$ 3D model group, $x_o$ is a first posture model feature, and $\beta=10$, $\gamma=0.1$, wherein $$E_1(p_0, G_m) = \sum_{j=1}^{4} D(p_0, p_{m_j}, j),$$

$$E_2(y_m) \sum_{i,j} A(i, j) \cdot y_m(i) \cdot y_m(j),$$

$$E_3(y_m, C) = \lambda \|y_m\|_0 + \sum_{c \in C} \|y_m(c) - 1\|_2^2,$$

$E_1(p_o, G_m)$ indicates a sum of four similarities between using postures of a second posture model in the 3D model group $G_m$ and that of corresponding regions of the first posture model, $E_2(y_m)$ is a combination compatibility of model categories, where $y_m$ is a binary vector, with each element corresponding to one category, and A is a weight matrix for model combination compatibility, $E_3(y_m, C)$ is a user constraint term, C is a set of model categories inputted by the user, and c is a model category in C, $D(p_0, p_{m_j}, j)$ is a similarity between a $j^{th}$ first region and a $j^{th}$ second region, and j is a positive integer smaller than or equal to q, $P_0$ is a posture in the first posture model, $p_{m_j}$ is a posture in an $m_j^{th}$ second posture model, $|y_m|_0$ is an L0 norm of $y_m$, and $\|y_m(c) - 1\|_2^2$ is a square of an L2 norm of $y_m(c) - 1$;

sorting the plurality of energy values, and pushing the 3D models corresponding to the sorted energy values to the user.

7. A posture-guided apparatus for combination modeling of cross-category 3D models, comprising:

a processor and a non-transitory computer readable medium, wherein the non-transitory computer readable medium stores instructions thereon, and when executed by the processor, the instructions cause the processor to receive a first posture model inputted by a user;

calculate similarities between q first regions of the first posture model and q second regions of each of second posture models in a preset model database respectively; wherein the model database comprises a plurality of models partitioned into model components, and second posture models corresponding to the models; the q first regions correspond to the q second regions one on one, wherein q is an integer greater than or equal to 2;

select one or more model components for each of the q first regions of the first posture model according to the similarities;

combine the model components selected for the q first regions of the first posture model to generate a cross-category 3D model, wherein the model components selected for the q first regions of the first posture model correspond to second regions of at least two different categories of second posture models, wherein the calculating module is specifically configured to:

calculate the similarities between the q first regions of the first posture model and the q second regions of each of the second posture models respectively according to a formula $$D(p_o, p_k, j) = \left\|P_o(\tilde{B}_j) - P_k(\tilde{B}_j)\right\|_2^2 + \sum_{i=1}^{19} \|\omega_i(x_o(i) - x_k(i))\|_2^2;$$

wherein $D(p_o, p_k, j)$ is a similarity between a $j^{th}$ first region and a $j^{th}$ second region, and j is a positive integer smaller than or equal to q, wherein $p_o$ is a posture in the first posture model, and $p_k$ is a posture in a $k^{th}$ second posture model; $x_o(i)$ and $x_k(i)$ are parameters of skeletons corresponding to $p_o$ and $p_k$, and i=1, ..., 19; $\omega_i$ is a weight, and $P_0(\tilde{B}_j)$ and $P_k(\tilde{B}_j)$ are coordinates of center bone points of the $j^{th}$ first region and the $j^{th}$ second region, respectively, and the $\|P_0(\tilde{B}_j)-P_k(\tilde{B}_j)\|_2^2$ is a square of an L2 norm of $P_o(\tilde{B}_j)-P_k(\tilde{B}_j)$, and the $\|\omega_i(x_0(i)-x_k(i))\|_2^2$ is a square of an L2 norm of $\omega_i(x_0(i)-x_k(i))$.

8. The apparatus according to claim 7, wherein the processor is further caused to determine whether model categories corresponding to the respective model components can be combined;

combine the selected plurality of model components to generate a cross-category 3D model when it is determined that the model categories corresponding to the respective model components can be combined.

\* \* \* \* \*